(12) United States Patent
Nishiuma et al.

(10) Patent No.: US 8,014,152 B2
(45) Date of Patent: Sep. 6, 2011

(54) ELECTRONIC SUBSTRATE DEVICE

(75) Inventors: Yoshitake Nishiuma, Chiyoda-ku (JP); Koji Hashimoto, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 229 days.

(21) Appl. No.: 12/480,292

(22) Filed: Jun. 8, 2009

(65) Prior Publication Data

US 2010/0124024 A1 May 20, 2010

(30) Foreign Application Priority Data

Nov. 20, 2008 (JP) ................................ 2008-296624

(51) Int. Cl.
*H05K 7/20* (2006.01)
(52) U.S. Cl. ........ 361/719; 361/704; 361/705; 361/717; 361/718; 257/706; 257/707; 257/713; 257/796; 165/80.2; 165/80.3
(58) Field of Classification Search .................. 337/704, 337/705, 717–719; 257/706, 707, 713, 796; 165/80.2, 80.3
See application file for complete search history.

(56) References Cited

U.S. PATENT DOCUMENTS

| | | | | |
|---|---|---|---|---|
| 4,396,936 A | * | 8/1983 | McIver et al. | 174/252 |
| 5,285,352 A | * | 2/1994 | Pastore et al. | 361/707 |
| 5,642,261 A | * | 6/1997 | Bond et al. | 361/704 |
| 5,661,902 A | * | 9/1997 | Katchmar | 29/840 |
| 5,710,459 A | * | 1/1998 | Teng et al. | 257/717 |
| 5,729,432 A | * | 3/1998 | Shim et al. | 361/690 |
| 5,903,052 A | * | 5/1999 | Chen et al. | 257/706 |
| 5,960,535 A | * | 10/1999 | Rubens et al. | 29/832 |
| 6,130,477 A | * | 10/2000 | Chen et al. | 257/712 |
| 6,297,959 B1 | * | 10/2001 | Ueno et al. | 361/704 |
| 6,821,816 B1 | | 11/2004 | Lawlyes | |
| 6,956,741 B2 | * | 10/2005 | Su | 361/704 |
| 7,202,559 B2 | * | 4/2007 | Zhao et al. | 257/707 |
| 2001/0050843 A1 | | 12/2001 | Ueno et al. | |
| 2004/0174682 A1 | * | 9/2004 | Lin et al. | 361/705 |
| 2004/0184240 A1 | * | 9/2004 | Su | 361/717 |
| 2007/0091578 A1 | * | 4/2007 | Chang et al. | 361/719 |

FOREIGN PATENT DOCUMENTS

| | | |
|---|---|---|
| DE | 102005034546 A1 | 1/2007 |
| EP | 1930944 A2 | 6/2008 |
| JP | 5-55422 A | 3/1993 |
| JP | 06069389 A * | 3/1994 |

(Continued)

*Primary Examiner* — Anatoly Vortman
(74) *Attorney, Agent, or Firm* — Sughrue Mion, PLLC

(57) ABSTRACT

This invention is to provide an electronic substrate device which is capable of reliably and stably transferring heat generated by a heat generating component to a base member serving as a heat dissipater without intermediation of an electronic substrate. An electronic substrate device according to the present invention, in which a base member (10A) includes a central protruding portion (15A) which is accommodated in a penetrating portion (32A) while facing a die pad (42A) through an intermediation of a first gap (G1), and first separated protruding portions (17a and 17b) which are provided around the central protruding portion (15A) and have a height dimension smaller than that of the central protruding portion (15A), the first separated protruding portions (17a and 17b) having a top surface which abuts a rear surface portion of the electronic substrate (30A) to form a second gap (G2), and in which a first heat transfer bond (16A) which is a heat conductive adhesive is applied to the first gap (G1) and the second gap (G2) communicating with the first gap (G1).

7 Claims, 6 Drawing Sheets

FOREIGN PATENT DOCUMENTS

| | | |
|---|---|---|
| JP | 09-246433 A | 9/1997 |
| JP | 2000-174179 A | 6/2000 |
| JP | 2003-115681 A | 4/2003 |
| JP | 2005-251994 A | 9/2005 |
| JP | 2006-294754 A | 10/2006 |

* cited by examiner

ELECTRONIC SUBSTRATE DEVICE

FIELD OF THE INVENTION

The present invention relates to an electronic substrate device for transferring and diffusing heat generated by a heat generating component which is mounted on an electronic substrate to a base member.

DESCRIPTION OF THE RELATED ART

As an electronic substrate device for transferring and diffusing heat generated by a heat generating component which is mounted on an electronic substrate to a heat dissipation plate or a heat sink, there are actually used electronic substrate devices of various structure.

For example, according to "mounting structure for electronic component" of Japanese patent application laid-open No. 2003-115681 (Patent Document 1) (FIG. 2, Abstract), there is disclosed a mounting structure composed by mounting electronic components including a heat generating element on a circuit substrate, in which a penetrating hole which penetrates through the circuit substrate is formed below the heat generating element of the circuit substrate.

In the above-mentioned mounting structure for electronic component, the circuit substrate is accommodated in a housing, and heat dissipation performance of the heat generating element is improved due to a thermal connection between the housing and the heat generating element through an intermediation of the penetrating hole by an adhesive.

Further, in Japanese patent application laid-open No. H.05-055422 (Patent Document 2) (FIG. 1, Abstract), there is disclosed an "integrated circuit device" in which a heat generating element is brazed to a surface of a circuit substrate by using a brazing filler metal, a heat dissipation plate is bonded to a rear side of the circuit substrate by an adhesive resin, and a protruding portion for keeping a coating thickness of the adhesive resin constant is provided between the circuit substrate and the heat dissipation plate.

In this integrated circuit device, the coating thickness of the adhesive resin between the circuit board and the heat dissipation plate can be consistently kept constant, thereby enabling elimination of harmful effects resulted from inconstant coating thickness of the adhesive resin.

In the mounting structure for electronic component according to Patent Document 1, an attachment relation between the heat generating element and the housing part is not specified, and means for ensuring a dimension of a heat transfer surface is not mentioned.

Accordingly, there is a problem in that, when the heat transfer distance fluctuates due to, for example, expansion of the adhesive and an error in attachment dimension, heat transfer and diffusion property fluctuates and an excessive separation stress is likely to be put on a solder connection part in a process of performing application of the adhesive.

Further, in the integrated circuit device of Patent Document 2, the circuit substrate is attached to the heat dissipation plate through an intermediation of the adhesive resin. Therefore, even when a homogeneous heat transfer adhesion is performed, heat generated by the heat generating element is transferred to the heat dissipation plate through an intermediation of the circuit substrate, thereby resulting in a problem in that heat resistance in a heat transfer path is so high that sufficient heat dissipation cannot be performed. Further, there is a problem also in that, when a protruding portion of the heat dissipation plate comes into contact with a conductive pattern on the circuit substrate, electric leakage occurs, and that the heat transfer distance fluctuates due to expansion of the heat transfer adhesive and the error in attachment dimension, whereby heat transfer and diffusion property fluctuates.

SUMMARY OF THE INVENTION

An object of the present invention is to solve the above-mentioned problems, and to provide an electronic substrate device in which, in an assembly manufacturing process, the excessive separation stress is not generated at the solder connection part of a connecting terminal of a heat generating component, and in which heat generated by the heat generating component can be reliably and stably transferred to a base member serving as a heat dissipater without intermediation of the electronic substrate.

To this end, according to the present invention, there is provided an electronic substrate device comprised: a heat conductive base member, which is fixed to an installation portion through an intermediation of attachment parts; a cover member, which is fixed to an outline peripheral portion formed so as to surround an outer peripheral edge portion of the base member; an electronic substrate, which is placed in an interior space between the base member and the cover member, and comprises a penetrating portion penetrating through a front surface portion facing with the cover member into a rear surface portion facing with the base member; and a heat generating component, which is mounted on the electronic substrate, and comprises a plurality of connecting terminals which are electrically connected, by soldering, to a die pad serving as a heat transfer member, a heat generating element attached to the die pad, and the front surface portion of the electronic substrate, wherein the base member comprises a central protruding portion, which is accommodated in the protruding portion while facing with the die pad through an intermediation of a first gap, and first separated protruding portions, which are provided around the central protruding portion, and have a height dimension smaller than that of the central protruding portion, the first separated protruding portions having a top surface, which abuts the rear surface portion of the electronic substrate to form a second gap, and wherein a first heat transfer bond, which is a heat conductive adhesive, is applied to the first gap and the second gap communicating with the first gap.

According to another aspect of an electric substrate device, there is provided an electronic substrate device comprised: a heat conductive base member, which is fixed to an installation portion through an intermediation of attachment parts; a cover member which is fixed to an outline peripheral portion formed so as to surround an outer peripheral edge portion of the base member; an electronic substrate, which is placed in an interior space between the base member and the cover member, and comprises a first planar pattern provided to a part of a rear surface portion facing with the base member; and a heat generating component, which comprises a plurality of connecting terminals which are electrically connected, by soldering, to a die pad which is a heat transfer member bonded to the first planar pattern by soldering, a heat generating element attached to the die pad, and the rear surface portion of the electronic substrate, wherein the base member comprises an accommodation recess, which accommodates the heat generating component through an intermediation of a first gap, and a first separated protruding portion, which is provided around the accommodation recess, and has a top surface which abuts the rear surface portion of the electronic substrate to form a second gap, and wherein a first heat transfer bond, which is a heat conductive adhesive, is applied to the first gap and the second gap communicating with the first gap.

According to still another aspect of an electric substrate device, there is provided an electronic substrate device comprised: a heat conductive base member, which is fixed to an installation portion through an intermediation of attachment parts; a cover member, which is fixed to an outline peripheral portion formed so as to surround an outer peripheral edge portion of the base member; an electronic substrate, which is placed in an interior space between the base member and the cover member, and comprises a rear surface portion facing with the base member and a front surface portion facing with the cover member; and a heat generating component, which is mounted on the electronic substrate, and comprises a plurality of connecting terminals, which are electrically connected, by soldering, to a die pad serving as a heat transfer member, a heat generating element attached to the die pad, and the rear surface portion of the electronic substrate, wherein the base member comprises an accommodation recess, which accommodates the heat generating component through an intermediation of a first gap, and a first separated protruding portion, which is provided around the accommodation recess, and has a top surface, which abuts the rear surface portion of the electronic substrate to form a second gap, and wherein a first heat transfer bond, which is a heat conductive adhesive, is applied to the first gap and the second gap communicating with the first gap.

In the electronic substrate device according to the present invention, with respect to the heat generating component mounted on the electronic substrate sandwiched between the base member and the cover member, the central protruding portion of the base member is constructed so as to face the die pad of the heat generating component through an intermediation of the gap, and the gap portion is applied with the heat transfer bond which is a heat conductive adhesive.

Accordingly, heat generated by the heat generating component can be transferred and diffused directly with respect to the base member without intermediation of the electronic substrate, and hence there is attained the effect of suppressing temperature increase of the heat generating component and the electronic substrate.

Further, by the first separated protruding portion provided on one surface of the base member, both the first gap dimension between the central protruding portion and the die pad and the second gap dimension between the base member and the electronic substrate can be ensured.

Therefore, a stable gap dimension can be obtained with simple structure, and hence heat transfer resistance can be suppressed.

The above and other objects, features and advantages of the present invention will become more readily apparent to those skilled in the art from the following detailed description of preferred embodiments of the present invention taken in conjunction with the accompany drawings.

DESCRIPTION OF THE PREFERRED EMBODIMENTS

Hereinafter, embodiments of the present invention are described with reference to the drawings. In each drawing, the same or corresponding components and portions are described while being denoted by the same reference symbols.

First Embodiment

Figure 1:
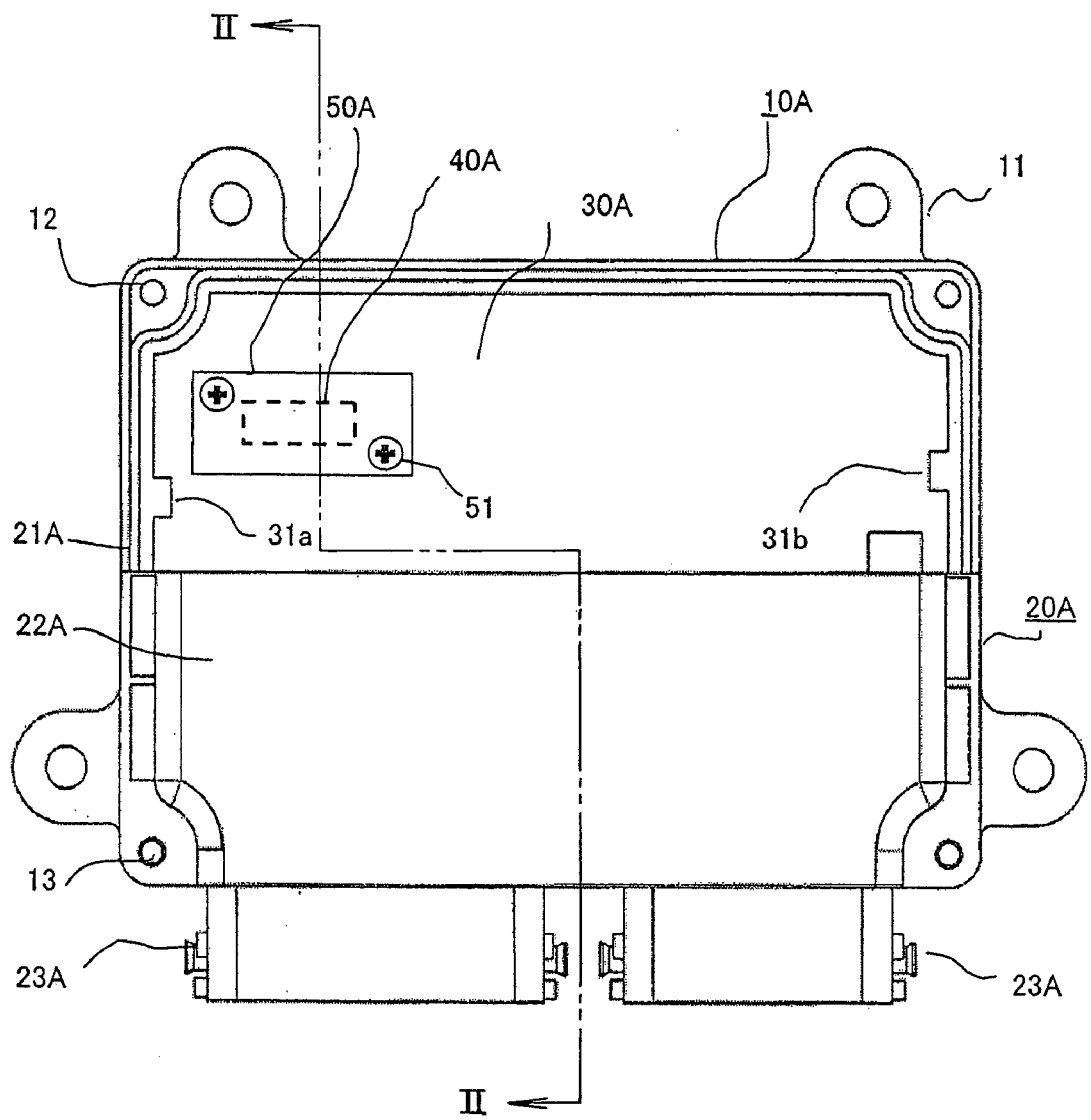
FIG. 1 is a partially cutaway plane view of the electronic substrate device according to a first embodiment of the present invention.
Figure 2:
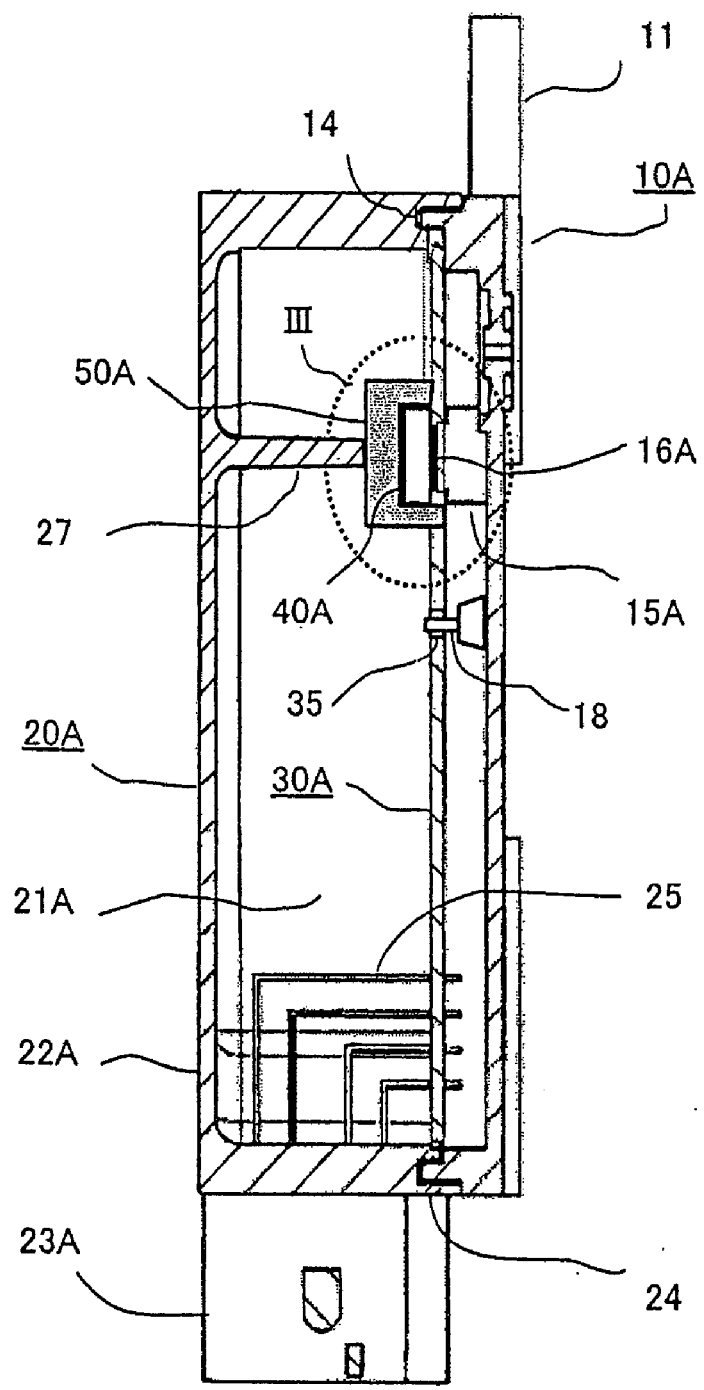
FIG. 2 is a sectional view taken along the line II-II of FIG. 1.
Figure 3:
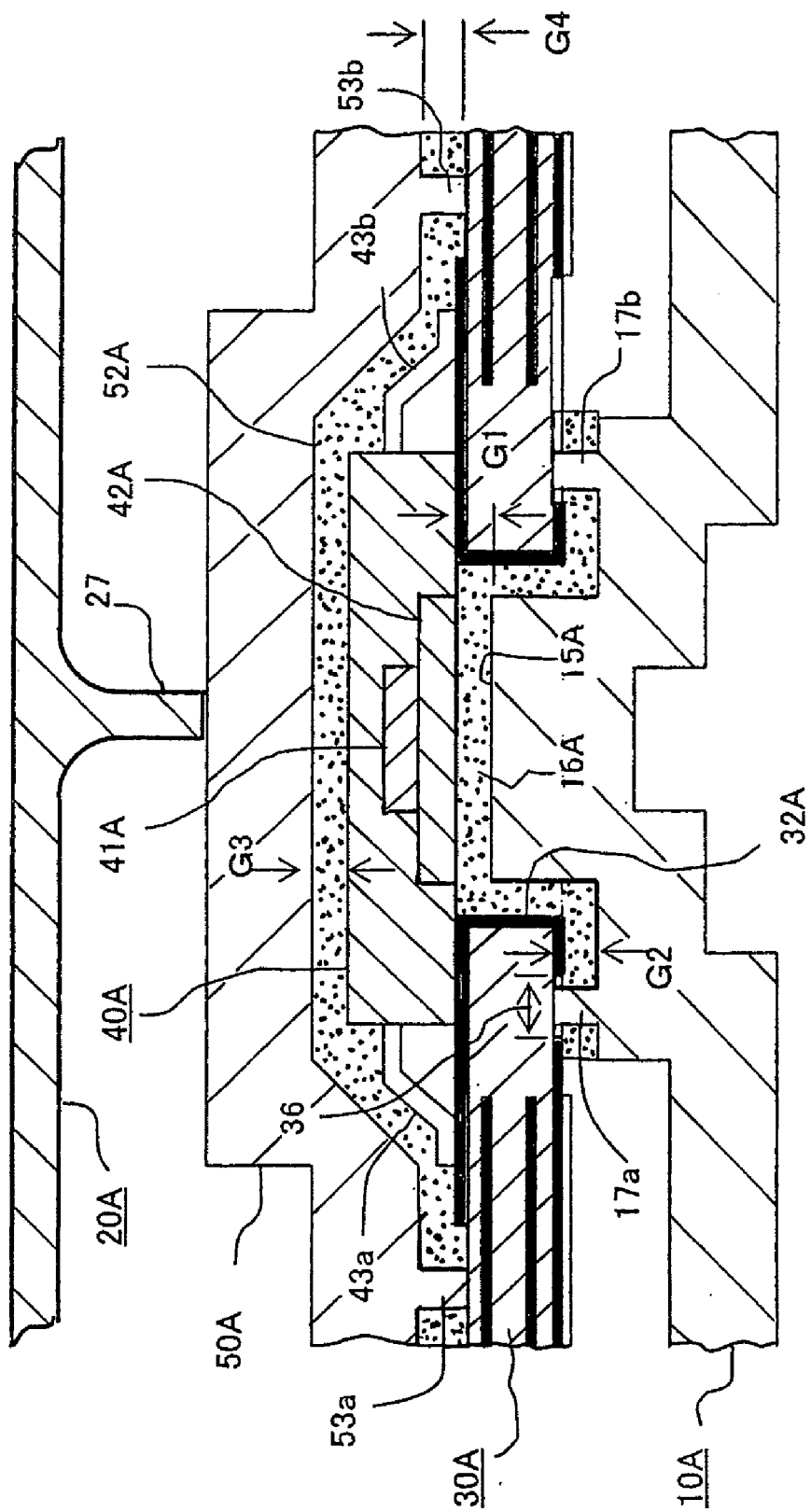
FIG. 3 is an enlarged view of a main portion III of FIG. 2.

FIGS. 1 to 3 illustrate an electronic substrate device according to a first embodiment of the present invention. FIG. 1 is a partially cutaway plane view of the electronic substrate device, FIG. 2 is a sectional view taken along the line II-II of FIG. 1, and FIG. 3 is an enlarged view of a main portion III of FIG. 2.

The electronic substrate device includes a base member 10A serving as a main heat-dissipating member and made by aluminum die casting, an electronic substrate 30A provided on the base member 10A, a heat generating component 40A mounted on the electronic substrate 30A, a heat sink 50A which covers the heat generating component 40A and serves as an auxiliary heat dissipating member, and a cover member 20A which sandwiches the electronic substrate 30A in cooperation with the base member 10A.

The rectangle base member 10A includes attachment legs 11 protruding on three side surfaces, and the electronic substrate device is fixed to, for example, a wall surface (not shown) serving as an installation portion through an intermediation of the attachment legs 11.

At four corners of the base member 10A, holes 12 are formed. A joint screw 13 is inserted into the hole 12 from a back surface of the base member 10A, and screwed in a filler nut (not shown) integrally formed with the cover member 20A.

In an outer peripheral edge portion of the base member 10A, there is formed a step-like outline peripheral portion 14 on which an entire peripheral edge portion of the electronic substrate 30A is placed. Further, directly below the heat generating component 40A, there is formed a central protruding portion 15A which constitutes a heat transferring pedestal portion protruding to a heat generating component 40A side.

Further, in the base member 10A, around the central protruding portion 15A, for example, a plurality of first separated protruding portions 17a and 17b having a height of approximately 0.3 mm are formed with interspaces.

In accordance with the height dimension of the columnar first separated protruding portions 17a and 17b, a gap dimension of a first gap G1 between a bottom surface of the heat generating component 40A and an upper surface of the central protruding portion 15A, and a gap dimension of a second gap G2 between a lower surface of the electronic substrate 30A and an upper surface of the base member 10A are determined.

Protrusion abutting surfaces 36 of top surfaces of the first separated protruding portions 17a and 17b, which abut the electronic substrate 30A, are formed as an insulative base from which a copper foil pattern is eliminated.

To the first gap G1 and the second gap G2 communicating with each other, a first heat transfer bond 16A which is a heat conductive adhesive is applied.

Further, a positioning pin 18 which fits in a positioning hole 35 formed in the electronic substrate 30A is integrally formed with the base member 10A.

Note that, in a case in which a total area of the electronic substrate 30A is relatively small, and the positioning of the base member 10A and the electronic substrate 30A is performed in accordance with an outline dimension of the outline peripheral portion 14 and an outer dimension of the electronic substrate 30A, the positioning pin 18 and the positioning hole 35 are unnecessary.

The cover member 20A which is a resin molding product includes an annular wall portion 21A, a canopy portion 22A, and a pair of connector housings 23A which are integrally molded with each other. In FIG. 1, an upper half of the canopy portion 22A is eliminated so that a part of an interior of the electronic substrate device can be seen.

In the canopy portion 22A, there is formed a protruding portion 27 having a top surface which abuts an upper surface of the heat sink 50A and pressing the heat sink 50A to an electronic substrate 30A side.

Note that, in a case where a total area of the electronic substrate 30A is relatively small, and deflection deformation of the electronic substrate 30A to the cover member 20A side dose not occur, it is only necessary to press the outer peripheral edge portion of the electronic substrate 30A by the annular peripheral wall portion 21A of the cover member 20A, and hence a presser protruding portion 27 is unnecessary.

One end portions of a large number of L-type connecting pins 25 are press-fitted into the pair of connector housings 23A provided on one surface of the annular wall portion 21A. Another end portions of the connecting pins 25 are connected to wiring patterns formed on a surface of the electronic substrate 30A by soldering.

Regarding the electronic substrate 30A, the outer peripheral edge portion thereof is placed on the outline peripheral portion 14 of the base member 10A, and an end portion of the outer peripheral edge portion is sandwiched between the outline peripheral portion 14 and the annular wall portion 21A of the cover member 20A. A plurality of notches 31a and 31b are formed on both the sides of the outer peripheral edge portion of the electronic substrate 30A.

Further, in the electronic substrate 30A, directly below the heat generating component 40A, there is formed a penetrating portion 32A accommodating the central protruding portion 15A of the base member 10A. An inner peripheral wall surface of the penetrating portion 32A is subjected to through-hole plating which allows front surface copper foil of the electronic substrate 30A to be electrically connected to rear surface copper foil thereof.

The heat generating component 40A includes a die pad 42A which is a heat transfer member provided directly above the penetrating portion 32A, an electronic component 41A which is a heat generating element attached to the die pad 42A, and a plurality of connecting terminals 43a, 43b which are electronically connected to the wiring patterns of the electronic substrate 30A by soldering.

The heat sink 50A is fixed to the electronic substrate 30A by fixing screws 51 which are provided diagonally opposite to each other. The heat sink 50A covers an entire upper surface of the heat generating component 40A including the connecting terminals 43a, 43b.

In the heat sink 50A, a plurality of second separated protruding portions 53a and 53b having top surfaces which abut the front surface portion of the electronic substrate 30A are formed around the heat generating component 40A with interspaces.

In accordance with the height dimension of the columnar separated protruding portions 53a and 53b, a gap dimension of a third gap G3 between a lower surface of the heat sink 50A and an upper surface of the heat generating component 40A, and a gap dimension of a fourth gap G4 between the lower surface of the heat sink 50A and a front surface portion of the electronic substrate 30A are determined.

To the third gap G3 and the fourth gap G4 communicating with each other, a second heat transfer bond 52A which is a heat conductive adhesive is applied.

The first heat transfer bond 16A and the second heat transfer bond 52A do not need strong adhesion performance. That is, there is used a liquid silicon resin material of cold setting type which is homogeneous to the waterproof sealing material 24 applied between the outline peripheral portion 14 of the base member 10A and an opening end surface of the annular wall portion 21A of the cover member 20A, and more preferably, there is used the heat transfer bond into which a high thermal conductive insulating filler is mixed.

However, due to provision of the first separated protruding portions 17a and 17b, the thickness of the first heat transfer bond 16A is set to a minimum distance necessary for performing insulation between the electronic substrate 30A and the base member 10A. Accordingly, in the case of adopting the heat generating component 40A generating relatively small amount of heat per unit area, it is possible to use, as the first heat transfer bond 16A, the liquid silicon resin material of cold setting type which is the same as the waterproof sealing material 24 instead of the heat transfer bond into which the high thermal conductive insulating filler is mixed.

Note that, as the first heat transfer bond 16A and the second heat transfer bond 52A, there is used an arbitrary material having adhesion viscosity which does not allow diffusion and outflow from the second gap G2 and the fourth gap G4 toward the outer side in a high temperature state, having heat conductivity higher than that of air, and having electrical insulation resistance.

On the other hand, generally, a material for the waterproof sealing material 24 is only necessary to ensure waterproof performance, and property of heat conductivity and insulation resistance is unnecessary.

The first heat transfer bond 16A and the second heat transfer bond 52A are applied to the penetrating portion 32A of the electronic substrate 30A and the heat sink 50A, respectively, in amounts slightly larger than capacity of the application space. Further, dimensions of the first separated protruding portions 17a and 17b and the second separated protruding portions 53a and 53b are determined such that, when the base member 10A and the cover member 20A are integrated with each other by clamping using the joint screws 13, the relationship between a first force F1 and a second force F2 becomes $F1 \leq F2$, the first force F1 being a force of the central protruding portion 15A of the base member 10A pushing up the heat generating component 40A through the intermediation of the first heat transfer bond 16A, the second force F2 being a force of the heat sink 50A pushing down the heat generating component 40A through the intermediation of the second heat transfer bond 52A.

That is, compared to watercourse resistance in which the second heat transfer bond 52A on the heat sink 50A side diffuses and flows outsides from the fourth gap G4, watercourse resistance in which the first heat transfer bond 16A on the base member 10A side diffuses and flows outsides from the second gap G2 is lower.

Note that, magnitude of diffusion and outflow watercourse resistance of the second heat transfer bond 52A from the fourth gap G4 to the outside and diffusion and outflow watercourse resistance of the first heat transfer bond 16A from the second gap G2 to the outside mainly results from an opening cross-section area of the diffusion and outflow watercourse. Diffusion and outflow watercourse resistance is adjusted by height dimensions of columnar first separated protruding portions 17a and 17b and second separated protruding portions 53a and 53b.

Next, assembly procedure of the electronic substrate device having the above-mentioned configuration is described.

First, a large number of electronic components (not shown) and the heat generating component 40A are mounted on the electronic substrate 30A, and electrically connected to wiring patterns on the electronic substrate 30A by soldering.

Next, the heat sink 50A applied with the second heat transfer bond 52A is fixed to the electronic substrate 30A with use of the fixing screws 51 so as to cover the heat generating component 40A.

Then, the electronic substrate 30A is temporally fixed by an opening end portion of the cover member 20A, and leading end portions of connecting pins 25 protruding from connector housings 23A are electrically connected to the wiring patterns of the electronic substrate 30A by soldering.

Subsequently, a canopy portion 22A of the cover member 20A is placed in a jig while being directed downward. An outer peripheral groove portion of the cover member 20A, in which the opening thereof is directed upward, is applied with the waterproof sealing material 24, and a penetrating portion 32A of the electronic substrate 30A is applied with the first heat transfer bond 16A serving as a heat conductive adhesive.

Finally, the outline peripheral portion 14 of the base member 10A is brought into contact with an opening end surface of an annular wall portion 21A of the cover member 20A, and the base member 10A is fastened and fixed to the cover member 20A with use of the joint screws 13.

The waterproof sealing material 24 is not adopted for integrally fixing the base member 10A and the cover member 20A with each other. Accordingly, the strong adhesion performance is not necessary, and stable waterproof performance can be maintained by using a cold-setting type liquid silicone resin material.

On the other hand, when the electronic substrate 30A is disassembled from the electronic substrate device, the annular wall portion 21A of the cover member 20A is cut by an ultrasonic cutter.

Subsequently, the nose of the driver is inserted into each of notches 31a and 31b of the electronic substrate 30A so as to raise the electronic substrate 30A by using the annular wall portion 21A as a fulcrum, whereby the electronic substrate 30A can be separately dismounted from the base member 10A.

As described above, in the electronic substrate device according to this embodiment, the base member 10A has a central protruding portion 15A, which faces the die pad 42A through the intermediation of a first gap G1, and is accommodated in the penetrating portion 32A of the electronic substrate 30A, and the first separated protruding portions 17a and 17b, which are provided around the central protruding portion 15A, and have a height dimension smaller than that of the central protruding portion 15A and in which top surfaces thereof are brought into contact with the rear surface portion of the electronic substrate 30A to form a second gap G2. The first gap G1 and the second gap G2 communicating with the first gap G1 are applied with the first heat transfer bond 16A.

Therefore, the heat generated by the heat generating component 40A is transferred and diffused to the base member 10A through the intermediation of not the electronic substrate 30A but the first heat transfer bond 16A, and temperature increase of the heat generating component 40A and the electronic substrate 30A can be suppressed.

Further, both the dimensions of the first gap G1 and the second gap G2 communicating with the first gap G1 can be ensured by the first separated protruding portions 17a and 17b formed on one surface of the base member 10A.

Therefore, the stable dimensions of the first gap G1 and the second gap G2 can be obtained with a simple structure, and heat transfer resistance can be suppressed.

Further, the electronic substrate device includes the heat sink 50A covering the entire of the heat generating component 40A through the intermediation of a third gap G3 and the second heat transfer bond 52A applied to the third gap G3.

Therefore, the heat generated by the heat generating component 40A is transferred and diffused to the base member 10A through the intermediation of the first heat transfer bond 16A, and is also transferred and diffused to the heat sink 50A through the intermediation of the second heat transfer bond 52A. As a result, the heat generated by the heat generating component 40A is diffused from both surfaces thereof, whereby temperature increase of the heat generating component 40A can be more suppressed.

Further, dimensions of the first separated protruding portions 17a and 17b and the second separated protruding portions 53a and 53b are determined such that, when the base member 10A and the cover member 20A are integrated with each other by the joint screws 13 serving as the joint means, the relationship between a first force F1 and a second force F2 becomes $F1 \leqq F2$, the first force F1 pressing the heat generating component 40A to the cover member 20A side through the intermediation of the first heat transfer bond 16A, the second force F2 pressing the heat generating component 40A to the base member 10A side through the intermediation of the second heat transfer bond 52A.

Therefore, in the assembly process of the electronic substrate device, a sufficient pressing force is imparted to the heat transfer bonds 16A and 52A, and the heat transfer bonds 16A and 52A are applied to application regions thereof without any gap. Further, any gap is not generated between the top surfaces of the first separated protruding portions 17a and 17b and the rear surface portion of the electronic substrate 30A, and the connecting terminals 43a, 43b connected to the wiring patterns of the electronic substrate 30A by soldering are not likely to be separated from the wiring patterns.

Further, the base member 10A and the cover member 20A are integrated with each other by the joint screws 13 serving as the joint means.

Therefore, the waterproof sealing material 24 applied between the base member 10A and the outline peripheral portion 14 of the cover member 20A, the first heat transfer bond 16A, and the second heat transfer bond 52A are not necessary to have a strong adhesion force, and can be efficiently applied in the same process with use of the same or homogeneous liquid silicon resin material of cold setting type.

Further, on the outer peripheral edge portion of the electronic substrate 30A, there are formed the notches 31a and 31b for separately dismounting the electronic substrate 30A from the base member 10A.

Therefore, the nose of the driver is inserted into each of the notches 31a and 31b of the electronic substrate 30A so as to raise the electronic substrate 30A by using the annular wall portion 21A as a fulcrum, whereby the electronic substrate 30A can be easily and separately dismounted from the base member 10A.

Second Embodiment

Figure 4:
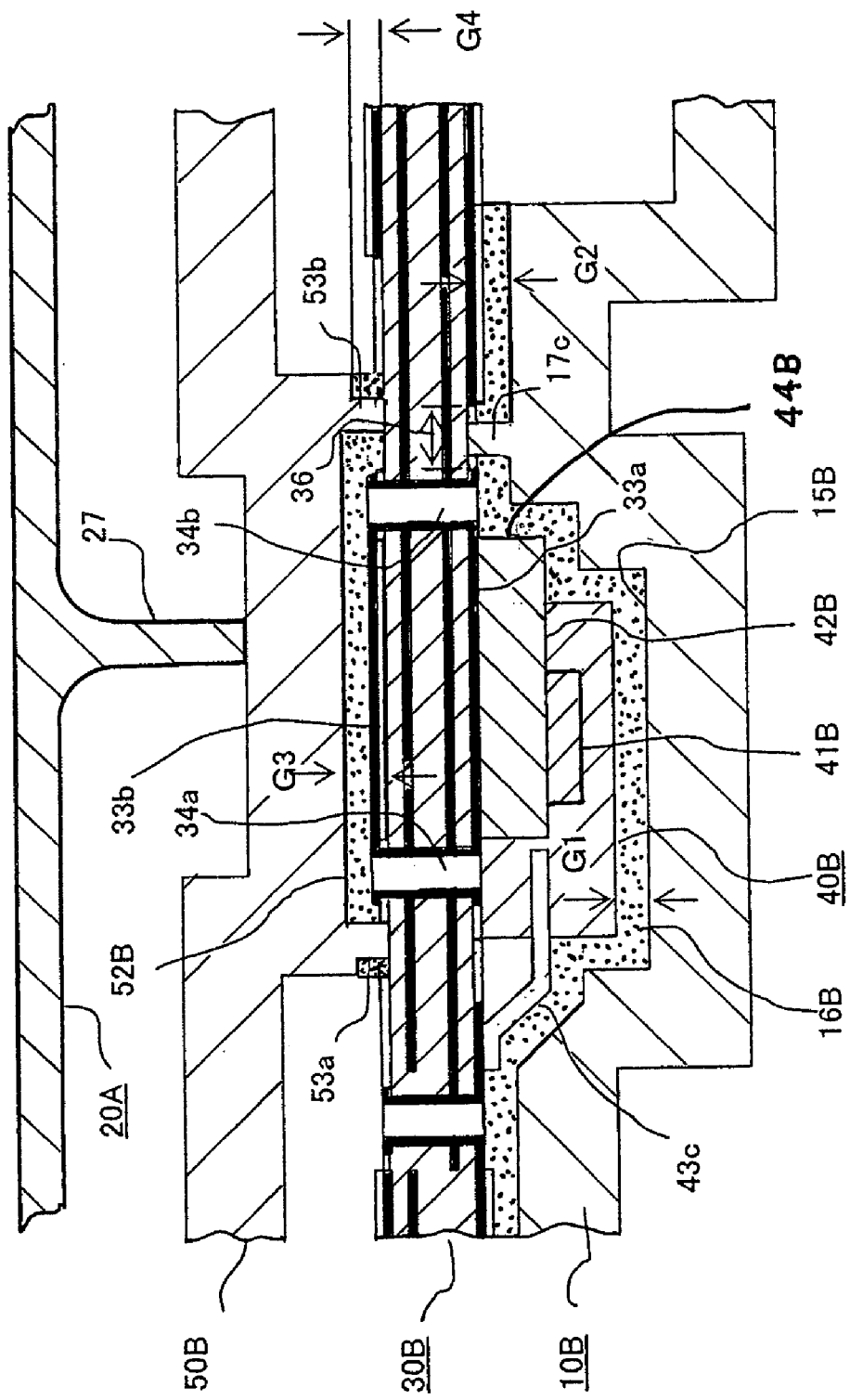
FIG. 4 is a sectional view of a main portion of an electronic substrate device according to a second embodiment of the present invention.

FIG. 4 is a sectional view of a main portion of an electronic substrate device according to a second embodiment of the present invention.

In this embodiment, an electronic substrate 30B is disposed in an interior space between the cover member 20A and a base member 10B which is a product molded by aluminum die casting.

The electronic substrate 30B has a first planar pattern 33a made of copper foil and provided on a rear surface portion thereof, a second planar pattern 33b made of copper foil and provided on a front surface portion opposed to the cover member 20A, and through-holes 34a and 34b which have inner wall surfaces subjected to copper plating and connect the second planar pattern 33b and the first planar pattern 33a so as to transfer heat therebetween.

The base member 10B has an accommodation recess 15B accommodating a heat generating component 40B through the intermediation of the first gap G1 and a first separated protruding portion 17c which is provided around the accommodation recess 15B and has a top surface which abuts the rear surface portion of the electronic substrate 30B to form the second gap G2 (between an upper surface of the base member 10B and the rear surface portion of the electronic substrate 30B), the first separated protruding portion 17c having, for example, a height of approximately 0.3 mm. A protrusion abutting surface 36 of the rear surface portion of the electronic substrate 30B, which the top surface of the first separated protruding portion 17c abuts, is an insulative base from which the copper foil pattern is eliminated.

The heat generating component 40B has a die pad 42B bonded by soldering to the first planar pattern 33a and having an exposed surface 44B, an electronic component 41B which is a heat generating element attached to the die pad 42B, and connecting terminals 43c electrically connected by soldering to the wiring patterns of the rear surface portion of the electronic substrate 30B.

The heat sink 50B is provided on the front surface portion side of the electronic substrate 30B. The heat sink 50B has second separated protruding portions 53a and 53b in which top surfaces thereof are brought into contact with the front surface portion of the heat sink 50B to form a third gap G3 and a fourth gap G4. In this case, the third gap G3 is formed between a lower surface of the heat sink 50B on the inner side of the second separated protruding portions 53a and 53b and the front surface portion of the electronic substrate 30B, and the fourth gap G4 is formed between the lower surface of the heat sink 50B on the outer side of the second separated protruding portions 53a and 53b and the front surface portion of the electronic substrate 30B.

The heat sink 50B is pressed to the electronic substrate 30B side by a presser protruding portion 27 of the cover member 20A.

The first gap G1 and the second gap G2 communicating with each other are applied with a first heat transfer bond 16B. The third gap G3 and the fourth gap G4 communicating with each other are applied with a second heat transfer bond 52B.

Similarly to the first heat transfer bond 16A and the second heat transfer bond 52A according to the first embodiment, regarding the first heat transfer bond 16B and the second heat transfer bond 52B, there is used a material which is the same as or homogeneous to the liquid silicon resin material of cold setting type used for the waterproof sealing material between the cover member 20A and the outline peripheral portion 14 of the base member 10B.

Other configuration is the same as that of the electronic substrate device according to the first embodiment.

Further, the assembly procedure of the electronic substrate device having the above-mentioned configuration is the same as that of the electronic substrate device according to the first embodiment.

In the electronic substrate device according to this embodiment, the heat generating component 40B is accommodated in the accommodation recess 15B of the base member 10B while interposing the first heat transfer bond 16B therebetween.

Therefore, the heat generated by the heat generating component 40B can be transferred and diffused to the base member 10B through the intermediation of the first heat transfer bond 16B, and temperature increase of the heat generating component 40B can be suppressed.

Further, both the dimensions of the first gap G1 and the second gap G2 can be ensured by the first separated protruding portion 17c provided on one surface of the base member 10B.

Therefore, the first gap G1 and the second gap G2 having the predetermined dimensions can be easily formed, and heat transfer resistance can be suppressed.

Further, the electronic substrate 30B has the second planar pattern 33b provided on the front surface portion thereof opposed to the cover member 20A, and the through-holes 34a and 34b which have the inner wall surfaces subjected to plating and connect the second planar pattern 33b and the first planar pattern 33a so as to transfer heat therebetween. Further, the heat sink 50B is disposed on the second planar pattern 33b side through the intermediation of the third gap G3 applied with the second heat transfer bond 52B.

Therefore, the heat generated by the electronic component 41B is also transferred and diffused to the heat sink 50B through the intermediation of the die pad 42B, the first planar pattern 33a, the through-holes 34a and 34b, the second planar pattern 33b, and the second heat transfer bond 52B. As a result, the heat generated by the heat generating component 40B is diffused not only to the base member 10B side but also to the heat sink 50B, whereby temperature increase of the heat generating component 40B can be more suppressed.

Note that, other operation and effect are the same as those of the first embodiment.

Third Embodiment

Figure 5:
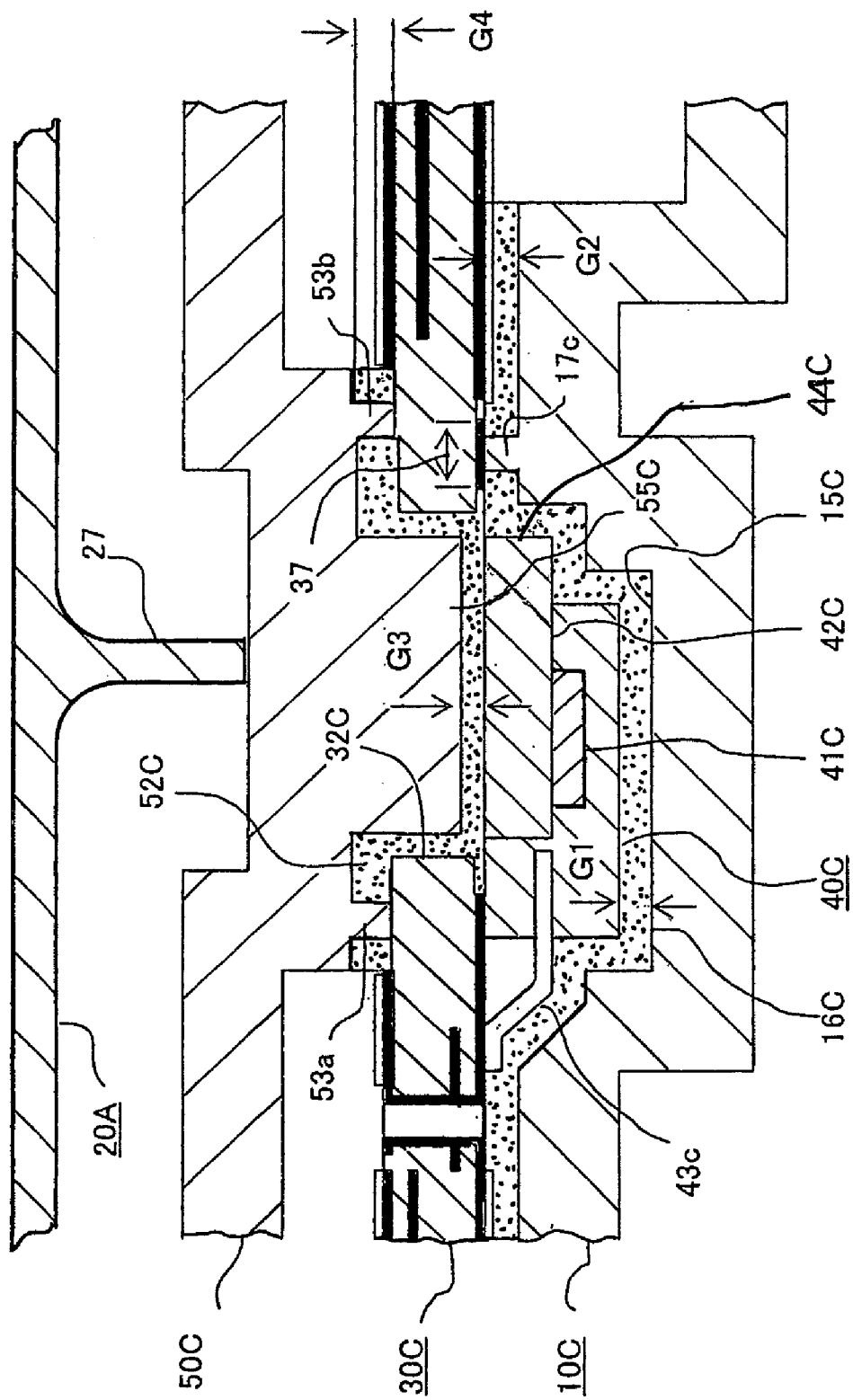
FIG. 5 is a sectional view of a main portion of an electronic substrate device according to a third embodiment of the present invention.

FIG. 5 is a sectional view of a main portion of an electronic substrate device according to a third embodiment of the present invention.

In this embodiment, an electronic substrate 30C is disposed in an interior space between the cover member 20A and a base member 10C which is a product molded by aluminum die casting.

In the electronic substrate 30C, a heat generating component 40C is mounted to the rear surface portion on the base member 10C side.

The heat generating component 40C serving as the heat generating element has a die pad 42C having an exposed surface 44C, an electronic component 41C which is a heat generating element attached to the die pad 42C, and a plurality of connecting terminals 43c electrically connected by soldering to the wiring patterns of the rear surface portion of the electronic substrate 30C.

The base member 10C has an accommodation recess 15C accommodating the heat generating component 40C through the intermediation of the first gap G1, and a first separated protruding portion 17c which is provided around the accommodation recess 15C, and in which a top surface thereof abuts the rear surface portion of the electronic substrate 30C to form the second gap G2.

The first gap G1 and the second gap G2 communicating with the first gap G1 are applied with the first heat transfer bond 16C.

The electronic substrate 30C has a penetrating portion 32C penetrating through the front surface portion into the rear surface portion of the electronic substrate 30C. A heat sink 50C is provided between the electronic substrate 30C and the cover member 20A. The heat sink 50C has second separated protruding portions 53a and 53b which are provided around the penetrating portion 32C and form the third gap G3 and the fourth gap G4, and a central protruding portion 55C which is accommodated in the penetrating portion 32C and faces the die pad 42C while interposing the third gap G3 therebetween.

The first gap G1 and the second gap G2 communicating with each other are applied with a first heat transfer bond 16C. The third gap G3 and the fourth gap G4 communicating with each other are applied with a second heat transfer bond 52C.

Similarly to the first heat transfer bond 16A and the second heat transfer bond 52A according to the first embodiment, as the first heat transfer bond 16C and the second heat transfer bond 52C, there is used a material which is the same as or homogeneous to the liquid silicon resin material of cold setting type used for the waterproof sealing material between the cover member 20A and the outline peripheral portion 14 of the base member 10B.

The height dimensions of the first separated protruding portion 17c and the second separated protruding portions 53a and 53b are determined such that, when the base member 10C and the cover member 20A are integrated with each other by the joint screws 13, the relationship between a first force F1 and a second force F2 becomes $F2 \leq F1$, the first force F1 pressing the heat generating component 40C to the cover member 20A side through the intermediation of the first heat transfer bond 16C, the second force F2 pressing the heat generating component 40C to the base member 10C side through the intermediation of the second heat transfer bond 52C.

Other configuration is the same as that of the electronic substrate device according to the first embodiment.

As described above, in the electronic substrate device according to this embodiment, the heat generating component 40C is accommodated in the accommodation recess 15C of the base member 10C while interposing the first heat transfer bond 16C therebetween.

Therefore, the heat generated by the heat generating component 40C can be transferred and diffused to the base member 10C through the intermediation of the first heat transfer bond 16C, and temperature increase of the heat generating component 40C can be suppressed.

Further, both the dimensions of the first gap G1 and the second gap G2 can be ensured by the first separated protruding portion 17c provided on one surface of the base member 10C.

Therefore, the first gap G1 and the second gap G2 having the predetermined dimensions can be easily formed, and heat transfer resistance can be suppressed.

Further, the electronic substrate 30C has the penetrating portion 32C penetrating through the front surface portion into the rear surface portion thereof, and the central protruding portion 55C of the heat sink 50C is accommodated in the penetrating portion 32C. The central protruding portion 55C faces the die pad 42C while interposing the third gap G3 therebetween, and the third gap G3 is applied with the second heat transfer bond 52C.

Therefore, the heat generated by the heat generating component 40C is also transferred and diffused to the heat sink 50C through the intermediation of the second heat transfer bond 52C. As a result, the heat generated by the heat generating component 40C is diffused not only to the base member 10C side but also to the heat sink 50C, whereby temperature increase of the heat generating component 40C can be more suppressed.

Further, the dimensions of the first separated protruding portion 17c and the second separated protruding portions 53a and 53b are determined such that, when the base member 10C and the cover member 20A are integrated with each other by the joint screws 13, the relationship between the first force F1 and the second force F2 becomes $F2 \leq F1$, the first force F1 pressing the heat generating component 40C to the cover member 20A side through the intermediation of the first heat transfer bond 16C, the second force F2 pressing the heat generating component 40C to the base member 10C side through the intermediation of the second heat transfer bond 52C.

Therefore, in the assembly process of the electronic substrate device, a sufficient pressing force is imparted to the heat transfer bonds 16C, 52C. Thus, the heat transfer bonds 16C, 52C are applied to application regions thereof without any gap, and the connecting terminals 43c connected to the wiring patterns of the electronic substrate 30C by soldering are not likely to be separated from the wiring patterns.

Note that, other operation and effect are the same as those of the first embodiment.

Next, a modification example of the above-mentioned electronic substrate devices according to the embodiments is described.

Figure 6:
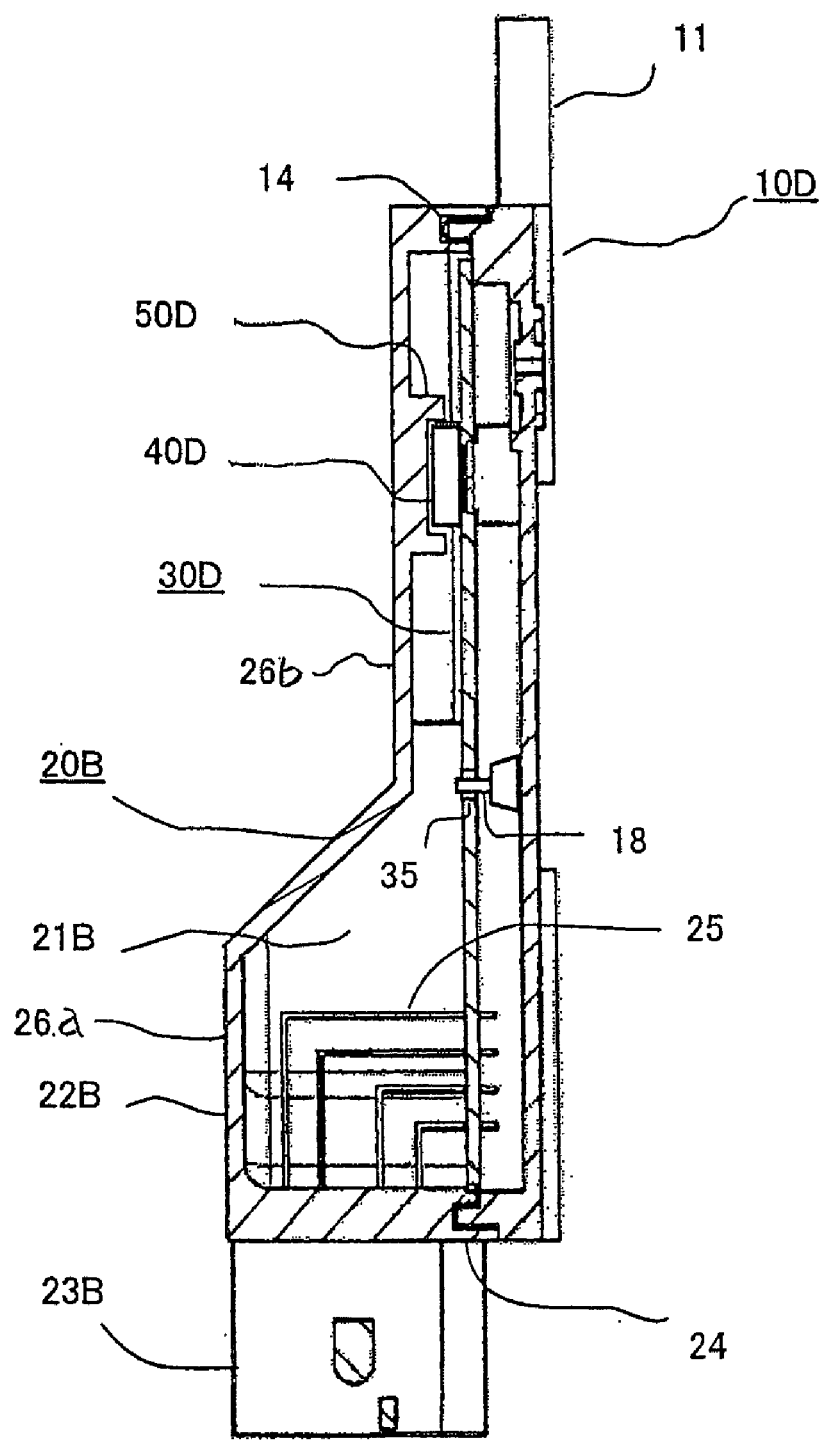
FIG. 6 is a sectional view of an electronic substrate device according to a modification example of the first embodiment of the present invention.

FIG. 6 is a sectional view of an electronic substrate device according to a modification example of the first embodiment of the present invention.

In this electronic substrate device, a cover member 20B fixed to the outline peripheral portion 14 of a base member 10D is formed of an annular wall portion 21B and a canopy portion 22B which are molded by aluminum die casting, and connector housings 23B which are assembled to the annular wall portion 21B and made of a resin.

The canopy portion 22B has a tall portion 26a directly below which the connector housings 23B are provided, and a short portion 26b directly below which a heat generating component 40D mounted on an electronic substrate 30D is provided. In a region, which is opposed to the heat generating component 40D, of the short portion 26b, there is formed a heat sink 50D protruding to the heat generating component 40D side.

Other configuration is the same as that of the electronic substrate device according to the first embodiment.

In this electronic substrate device, the heat sink 50D is molded integrally with the cover member 20B, and it is possible to enhance a heat dissipating effect without the necessity for a component for jointing two components.

Note that, regarding the second and third embodiments, the cover member 20A and the heat sink 50B, 50C may be molded integrally with each other by aluminum die casting.

Further, in the above-mentioned embodiments and modification example, the cover member 20A, 20B has the annular wall portion 21A, 21B and the canopy portion 22A, 22B integrated with each other, and there is described the housing in which fastening for fixation of the cover member 20A, 20B and the base member 10A, 10B, 10C, 10D is formed by the joint screws 13 provided at the outer positions of the cover member 20A, 20B. However, as a matter of course, the present invention is not limited thereto.

For example, the annular wall portion 21A, 21B and the canopy portion 22A, 22B may have a separate structure respectively, and there may be adopted a housing in which, after the base member 10A, 10B, 10C, 10D is fastened and fixed to the annular wall portion 21A, 21B at the inner peripheral position of the annular wall portion 21A, 21B, the canopy portion 22A, 22B is attached and fixed thereto.

In this case, the joint screws 13 are screwed in cap screw holes which are provided on the side of the base member 10A, 10B, 10C, 10D inserted from the inner surface side of the annular wall portion 21A, 21B, whereby the immersion of water from the joint screw portion can be prevented.

In addition, while the base member 10A, 10B, 10C, 10D is the product molded by aluminum die casting, the base member 10A, 10B, 10C, 10D may be a sheet metal member produced by press working. The separated protruding portions 17a, 17b, and 17c in this case is formed of a dowel which is struck from the rear surface of the sheet metal by a pin.

Further, in the first gap G1 between the base member 10A, 10B, 10C, 10D and the heat generating component 40A, 40B, 40C, 40D (first to third embodiments), the third gap G3 between the heat sink 50A, 50C, 50D and the heat generating component 40A, 40C, 40D (first and third embodiments), or the third gap G3 between the heat sink 50B and the second planar pattern 33b (second embodiment), there are mixed in some cases conductive foreign matter such as minute cut pieces and wire debris which are difficult to be found out and removed.

In this case, a short circuit occurs in some cases between the connecting terminals 43a, 43b, 43c or the die pad 42A, 42B, 42C of the heat generating component 40A, 40B, 40C, 40D and the base member 10A, 10B, 10C, 10D or the heat sink 50A, 50B, 50C, 50D.

In order to avoid such a situation, the base member 10A, 10B, 10C, 10D and the heat sink 50A, 50B, 50C, 50D may be made of an aluminum material, and the opposed surface on the heat generating component 40A, 40B, 40C, 40D side may be subjected to alumite treatment (anodizing) so as to form an electric insulating layer.

Further, in the first and second embodiments, the top surface of the separated protruding portions 17a, 17b, 17c, 53a, and 53b and the protrusion abutting surface 36 of the electronic substrate 30A, 30B for forming the first gap G1 to the fourth gap G4 are the insulative bases in which the copper foil patterns are eliminated. In the third embodiment, the top surface of the separated protruding portion 17c and the protrusion abutting surface 37 of the electronic substrate 30C for forming the first gap G1 and the second gap G2 are island-shaped copper foil lands which are not connected to other copper foil patterns.

As a matter of course, the present invention is not limited thereto. The top surface of the separated protruding portions 17a, 17b, 17c, 53a, and 53b and the protrusion abutting surface 36, 37 of the electronic substrate 30A, 30B, 30C may be the insulative bases in which the copper foil patterns are eliminated or the island-shaped copper foil lands which are not connected to other copper foil patterns.

Further, in the first to third embodiments, as the positioning means that does not allow the separated protruding portions 17a, 17b, and 17c to mixedly contact the circuit pattern, there is adopted means that regulates the relative position by a minute gap generated between the outline portion of the electronic substrate 30A, 30B, 30C, 30D and the outline peripheral portion 14 provided to the base member 10A, 10B, 10C, 10D, or by fitting the positioning pin 18 provided to the base member 10A, 10B, 10C, 10D into the positioning hole 35 provided to the electronic substrate 30A, 30B, 30C, 30D.

As a matter of course, the present invention is not limited thereto, and the penetrating portion 32A of the electronic substrate 30A illustrated in FIG. 3 according the first embodiment may be used for positioning the electronic substrate 30A with the base member 10A.

That is, there are formed a large number of the through-hole platings which have inner wall surfaces subjected to copper plating and electrically connect the front surface portion and the rear surface portion of the electronic substrate 30A with each other so as to surround the penetrating portion 32A, and the through-hole plating effected on the inner peripheral wall surface of the penetrating portion 32A may be eliminated. In this way, the penetrating portion 32A and the central protruding portion 15A can be fitted into close contact with each other, making it possible to regulate positioning between the electronic substrate 30A and the base member 10A and deviation of the relative position.

Further, the heat transfer bond 16A, 16B, 16C, 52A, 52B, 52C is pressed when the base member 10A, 10B, 10C, 10D is fastened and fixed to the cover member 20A, 20B by the joint screws 13, and tends to flow out to the front surface portion or the rear surface portion of the electronic substrate 30A, 30B, 30C, 30D. However, when abutting surfaces of the separated protruding portions 17a, 17b, 17c, 53a, and 53b and the electronic substrate 30A, 30B, 30C, 30D are separately opened by the heat transfer bond 16A, 16B, 16C, 52A, 52B, 52C which is to be applied while being pressed in this time, stable first gap G1 to fourth gap G4 cannot be ensured.

Means that prevents the abutting surfaces of the separated protruding portions 17a, 17b, 17c, 53a, and 53b and the electronic substrate 30A, 30B, 30C, 30D from being separately opened is that the outer peripheral portion of the electronic substrate 30A, 30B, 30C, 30D is first sandwiched by the cover member 20A, 20B at the position of the outline peripheral portion 14 of the base member 10A, 10B, 10C, 10D, and that the electronic substrate 30A, 30B, 30C, 30D is considered to have a sufficient thickness with respect to a ratio of its area. In a case where the area of the electronic substrate 30A, 30B, 30C, 30D is large with respect to a ratio of its thickness, the electronic substrate 30A, 30B, 30C, 30D may be pressed to the base member 10A, 10B, 10C, 10D side from the front surface side of the electronic substrate 30A, 30B, 30C, 30D through the intermediation of the heat sink 50A, 50B, 50C, 50D by the presser protruding portion 27 provided to the cover member 20A, 20B, or the electronic substrate 30A, 30B, 30C, 30D, as illustrated in FIG. 6, may be pressed to the base member 10D side from the front surface side of the electronic substrate 30D through the intermediation of the separated protruding portion provided to the heat sink 50D by the cover member 20B manufactured by aluminum die casting.

Further, in a case where the cover member 20A made of a resin as illustrated in FIG. 2 is used, a central suspended portion (not shown) is protruded from the canopy portion 22A of the cover member 20A, and the central suspended portion is brought into contact with the front surface portion of the electronic substrate 30A. As a result, the electronic substrate 30A can be pressed to the base member 10A side by an intermediate joint screw (not shown) inserted from a pedestal on the bottom surface of the base member 10A.

In this case, a filler having a screw hole is embedded to the central suspended portion, and a fit-in hole to which the intermediate joint screw is inserted is provided to the base member 10A and the electronic substrate 30A. Further, a head of the intermediate joint screw is applied with the waterproof sealing material, preventing the immersion of water from the fit-in hole.

As described above, in a case where the electronic substrate 30A does not have sufficient plane strength, the electronic substrate 30A and the separated protruding portion are prevented by auxiliary means from being separately opened, and the stable dimensions of the first gap G1 to the fourth gap G4 are ensured, whereby it is possible to stabilize heat transfer and diffusion property with respect to the heat generating component 40A, 40B, 40C, 40D.

What is claimed is:

1. An electronic substrate device, comprising:
    a heat conductive base member, which is fixed to an installation portion through an intermediation of attachment parts;
    a cover member, which is fixed to an outline peripheral portion formed so as to surround an outer peripheral edge portion of the base member;
    an electronic substrate, which is placed in an interior space between the base member and the cover member, and comprises a penetrating portion penetrating through a front surface portion facing with the cover member into a rear surface portion facing with the base member; and
    a heat generating component, which is mounted on the electronic substrate, and comprises a plurality of connecting terminals which are electrically connected, by soldering, to the electronic substrate, and comprises a die pad serving as a heat transfer member, a heat generating element attached to the die pad, and the front surface portion of the electronic substrate,
    wherein the base member comprises a central protruding portion, which is accommodated in the penetrating portion while facing with the die pad through an intermediation of a first gap, and first separated protruding portions, which are provided around the central protruding portion, and have a height dimension smaller than that of the central protruding portion, the first separated protruding portions having a top surface, which abuts the rear surface portion of the electronic substrate to form a second gap, and
    wherein a first heat transfer bond, which is a heat conductive adhesive, is applied to the first gap and the second gap communicating with the first gap.

2. An electronic substrate device according to claim 1, comprising:
    a heat sink, which covers an entire of the heat generating component through an intermediation of a third gap; and
    a second heat transfer bond, which is a heat conductive adhesive applied to the third gap.

3. An electronic substrate device according to claim 2,
    wherein the heat sink comprises second protruding portions having a top surface, which abuts the front surface portion of the electronic substrate to form a fourth gap, and
    wherein dimensions of the first separated protruding portions and the second separated protruding portions are determined such that, when the base member and the cover member are integrated with each other by a joint means, a relationship between a first force (F1) and a second force (F2) becomes $F1 \leqq F2$, the first force (F1) pressing the heat generating component to a cover member side through an intermediation of the first heat transfer bond, the second force pressing the heat generating component to a base member side through an intermediation of the second heat transfer bond, and
    wherein watercourse resistance in which the first heat transfer bond flows outsides is lower than watercourse resistance in which the second heat transfer bond flows outsides.

4. An electronic substrate device according to claim 1, wherein a waterproof sealing material, which is a liquid silicon resin material of cold setting type which is the same as or homogeneous to the first heat transfer bond and the second heat transfer bond, is applied between an opening end surface of the cover member and the outline peripheral portion of the base member.

5. An electronic substrate device according to claims 2, wherein the cover member is made of a heat conductive material, and integrally formed with the heat sink.

6. An electronic substrate device according to claim 1, wherein a surface of the base member side of the first gap, to which the first heat transfer bond is applied, is subjected to an alumite treatment which provides electrical insulation resistance.

7. An electronic substrate device according to claim 2, wherein a surface of the heat sink side of the third gap, to which the second heat transfer bond is applied, is subjected to an alumite treatment which provides electrical insulation resistance.

* * * * *